United States Patent
Brodsky et al.

(10) Patent No.: US 7,252,515 B2
(45) Date of Patent: Aug. 7, 2007

(54) NON-ORIENTED WIRE IN ELASTOMER ELECTRICAL CONTACT

(75) Inventors: William L. Brodsky, Binghamton, NY (US); William E. Buchler, Jr., Owego, NY (US); Benson Chan, Vestal, NY (US); Michael A. Gaynes, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/650,748

(22) Filed: Jan. 8, 2007

(65) Prior Publication Data

US 2007/0111558 A1   May 17, 2007

Related U.S. Application Data

(60) Division of application No. 11/262,134, filed on Oct. 28, 2005, which is a continuation of application No. 10/873,037, filed on Jun. 22, 2004, now Pat. No. 6,981,880.

(51) Int. Cl.
  *H01R 4/58* (2006.01)
(52) U.S. Cl. ...................................... 439/66
(58) Field of Classification Search .................. 439/66, 439/67, 91; 174/110 F, 110 S, 254, 259, 174/260–262; 438/123, 107, 108; 257/778, 257/785, 777; 361/785, 792, 803, 804; 29/840
See application file for complete search history.

(56) References Cited

U.S. PATENT DOCUMENTS

| | | | |
|---|---|---|---|
| 5,298,686 A * | 3/1994 | Bourdelaise et al. | 174/254 |
| 5,945,897 A * | 8/1999 | Pluymers et al. | 333/244 |
| 6,028,870 A * | 2/2000 | Deutsch et al. | 372/25 |
| 6,054,651 A * | 4/2000 | Fogel et al. | 174/110 F |
| 6,103,554 A * | 8/2000 | Son et al. | 438/126 |
| 6,132,226 A | 10/2000 | Noda | 439/91 |
| 6,264,476 B1 * | 7/2001 | Li et al. | 439/66 |
| 6,336,269 B1 * | 1/2002 | Eldridge et al. | 29/885 |
| 6,386,890 B1 * | 5/2002 | Bhatt et al. | 439/67 |
| 6,525,429 B1 * | 2/2003 | Kovac et al. | 257/778 |
| 6,555,412 B1 * | 4/2003 | Wensel | 438/106 |
| 6,589,819 B2 * | 7/2003 | Smith et al. | 438/123 |
| 7,114,961 B2 * | 10/2006 | Williams | 439/66 |
| 7,126,364 B2 * | 10/2006 | Jardin-Lemagnen et al. | 324/761 |
| 2003/0094666 A1 | 5/2003 | Clayton et al. | 257/459 |

* cited by examiner

*Primary Examiner*—Alexander Gilman
(74) *Attorney, Agent, or Firm*—John A. Jordan; William H. Steinberg

(57) ABSTRACT

A method and apparatus for interconnecting an electronic module to a substrate through resilient wire conductors in an interposer arrangement. A carrier layer of insulating material with an array of apertures, arranged to align with both the electrical pads on an electronic module and electrical contacts on a substrate, each hold, for example, a resilient wadded wire connector. Each connector extends through the aperture provided and beyond the upper and lower surfaces of the carrier layer. Each resilient wadded wire connector and aperture is encapsulated with a elastomeric insulating material sufficiently deformable so as to allow said resilient wadded wire connector to deform upon application of a normal force from each side tending to depress the connector into its aperture. The encapsulation prevents loss or smear of a wadded wire connector when handling.

13 Claims, 11 Drawing Sheets

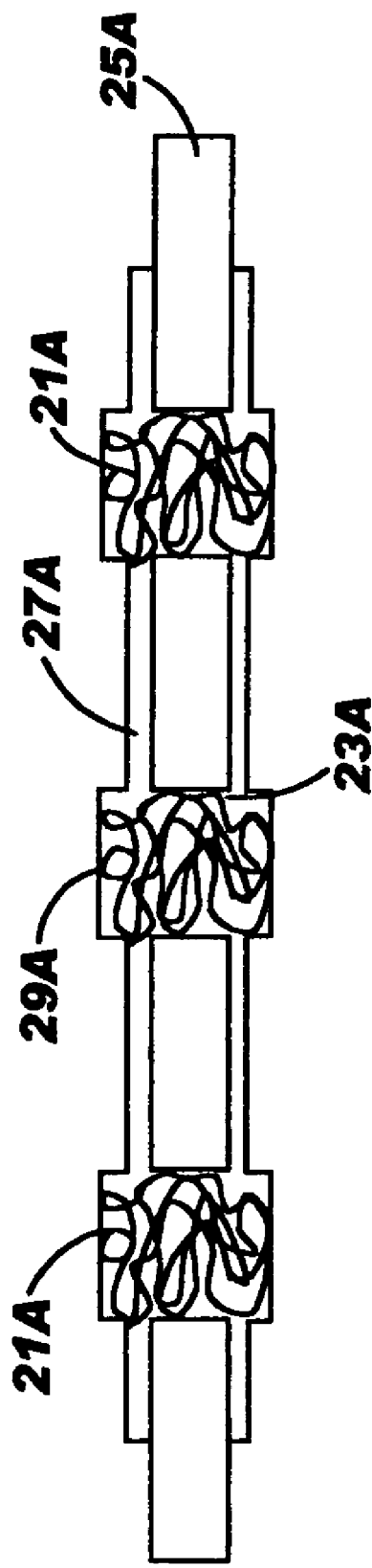
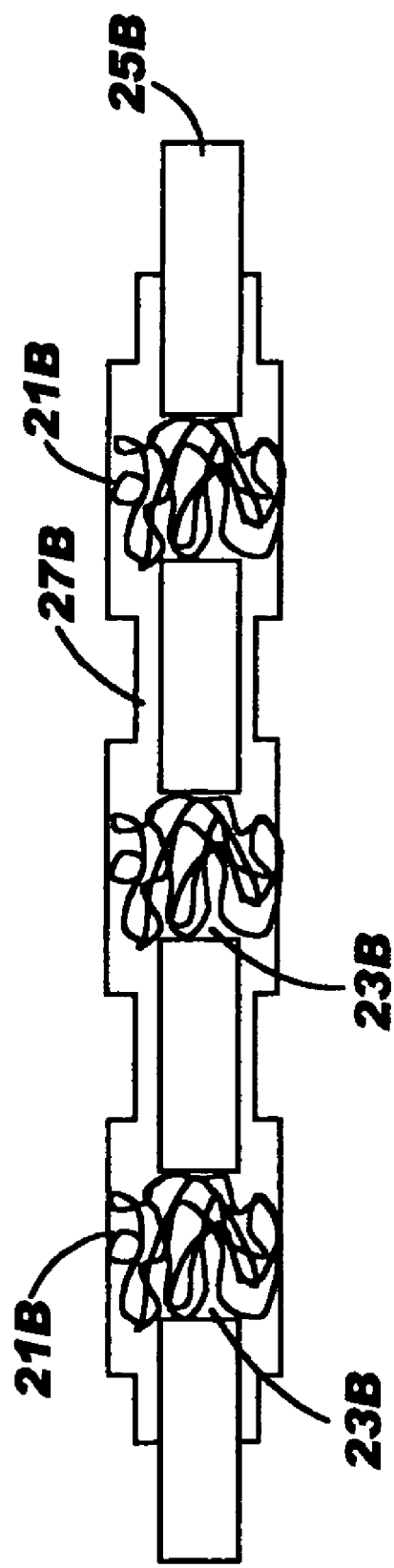

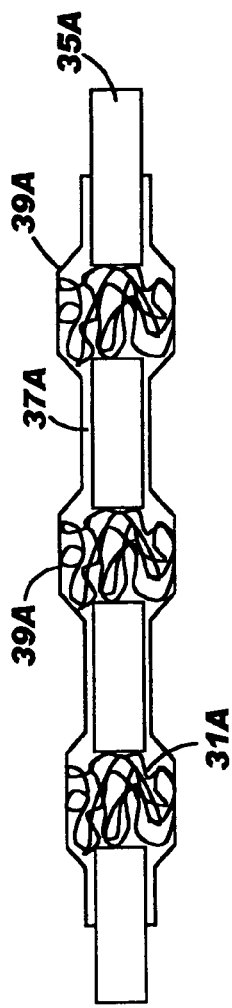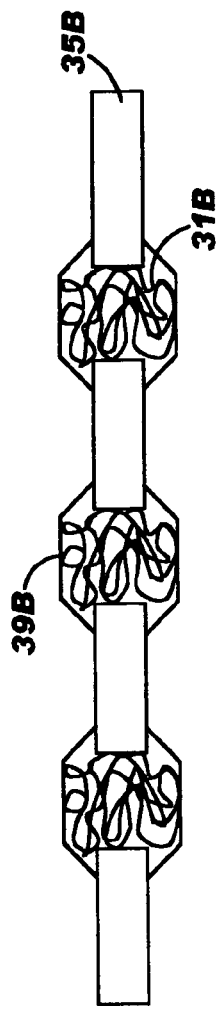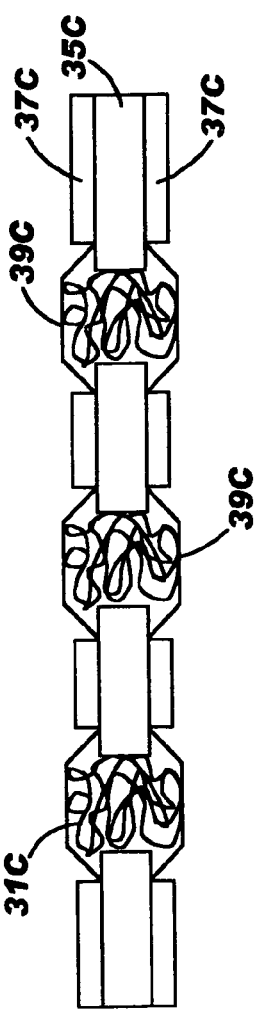

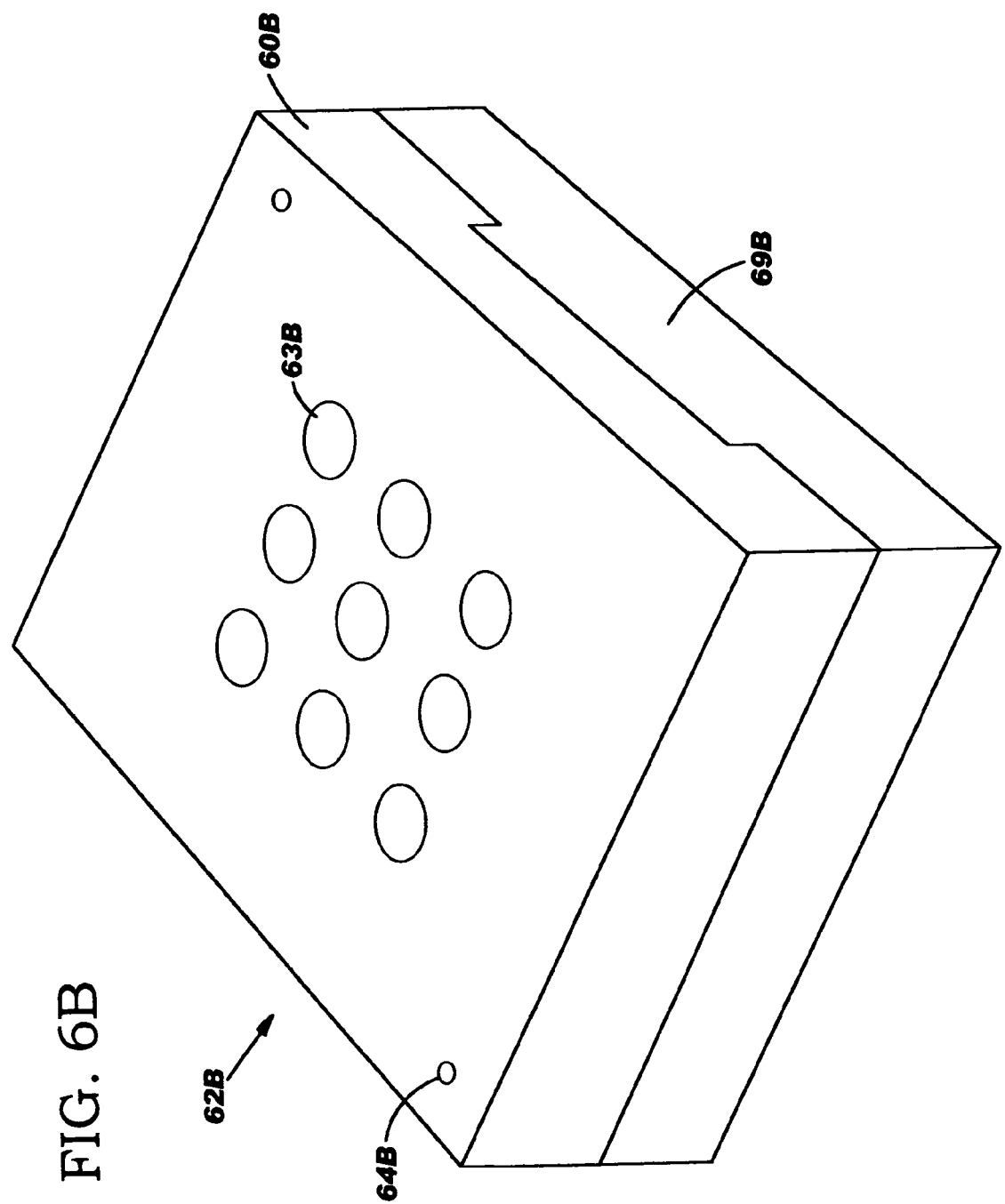

NON-ORIENTED WIRE IN ELASTOMER
ELECTRICAL CONTACT

This application is a divisional application of a copending continuation application Ser. No. 11/262,134, filed Oct. 28, 2005 and allowed Dec. 12, 2006, which continuation application is based on parent application Ser. No. 10/873,037, filed Jun. 22, 2004 now U.S. Pat. No. 6,981,880 and allowed on Sep. 13, 2005.

BACKGROUND OF THE INVENTION

1. Field of the Invention

The present invention relates to electronic packaging. More particularly, the present invention relates to electronic interposers used in electronic packaging to make electrical connection of electronic modules to printed wiring boards, and the like.

2. Background and Related Art

Compression connectors, such as those employed in land grid array (LGA) connections, are well known in the art. Typical LGA compression connections employ an interposer to connect a single chip or multiple chip module (MCM) to a printed wiring board (PWB). The MCM generally comprises multiple integrated circuits or chips assembled into a subsystem the size of traditional single chip packages. The single chip or MCM may be connected to the PWB through the interposer with the chip module circuit pads making contact with the array of connection points extending from one surface of the interposer and the PWB circuit pads making contact with the array of connections extending from the other surface of the interposer. Compression forces are employed to hold the chip module and PWB against the interposer.

Various forms of interposers have been designed to facilitate the LGA connection of the single chip or MCM to the PWB. One of the considerations in designing interposers is to create a structure that will accommodate the thermal mismatch between chip module and PWB. Another consideration in designing interposers is to create a structure that will accommodate differences in topography between the mating surface profiles and mating conductor of the chip module and PWB.

Interposer layers of both substantially rigid and relatively resilient insulating materials have been employed for this purpose. In using such materials, a variety of conductor interconnect structures have been employed in the prior art to electrically connect the contacts or pads on one surface of the interposer to the corresponding contacts or pads on the other surface of the interposer. One form of conductor interconnect structure employed is designed to be resilient or deformable. As such, the deformable conductor can move to accommodate, for example, the CTE dimensional mismatch between the chip module and PWB.

One example of a resilient or deformable conductor used in rigid or semi-rigid layers of insulating material is the resilient wadded-wire connector, sometimes also known as the "fuzz-button" type connector or the connector made by CINCH Connectors, Inc. under the trademark CIN::APSE. An example of such type of connector is found in U.S. Pat. No. 6,386,890. The interposer in such arrangements typically comprises a substantially rigid interposer layer of plastic having a plurality or array of apertures with each aperture further having disposed thereon a deformable, randomly configured, resilient conductor material for connecting a MCM, for example, to a PWB. The resilient conductors of wadded wire are typically held by friction within a plastic layer.

Such wadded-wire button or connector arrangements have proven to be reliable once assembled but have been found somewhat difficult to handle beforehand without causing damage to, or displacement of, the wadded-wire button connector. Contact with the wadded-wire button connectors in handling may result in missing button connectors or pulled/smeared button connectors. Since the connectors are typically retained in the interposer layer by friction, they are prone to being pushed or pulled from position. In addition, handling may result in smearing a button connector wherein handling contact with the connector causes a portion of the wadded-wire to become unwadded and free of the aperture wherein it may extend across the surface of the interposer material and short to the wadded-wire button connector of an adjacent aperture.

FIG. 1 depicts an example of a typical wadded-wire button connector arrangement which, as can be seen, is randomly wound. An array of nine such connectors is shown to illustrate the connector arrangement but it is understood that, in practice, the array of connectors would typically be made much greater. As shown in FIG. 1A, wadded-wire connectors 1 are held by friction in apertures 3 in insulating layer 5. As shown in FIG. 1B, the wire of button connector 1 has been smeared to unwind portion 7 such that it could short to an adjacent wadded wire button connector.

SUMMARY OF THE PRESENT INVENTION

It is, therefore, an object of the present invention to provide an improved electronic package.

It is a further object of the present invention to provide an improved method and apparatus for connecting an electronic module to a substrate therefor.

It is yet a further object of the present invention to provide an improved interposer structure for connecting an electronic module to a substrate, such as, a PWB.

It is yet still a further object of the present invention to provide a resilient wadded-wire button connector interposer structure with the connectors encapsulated within a compliant or deformable elastomeric insulator material to thereby increase reliability of the interposer structure.

It is another object of the present invention to provide a rigid/semi-rigid or resilient interposer insulating layer with an array of apertures containing wadded-wire connectors encapsulated with a compliant elastomeric insulating material sufficient to retain and contain the wound wadded-wire but yet which elastomeric may be sufficiently soft to deform and allow the wadded-wire to protrude therethrough under compression between electronic module and substrate.

In accordance with the present invention, there is provided an improved LGA connector for connecting an electronic module, such as a single chip or MCM module, to a substrate, such as a PWB. The LGA connector comprises at least one carrier layer of dielectric insulating material having an array of apertures each holding randomly wound wadded-wire connectors. The connectors are encapsulated with a compliant eleastomeric material, preferably having a relatively low modulus, to retain and contain the wadded wire so as to protect the wires from being pulled or lost. The elastomeric material may be sufficiently soft so that the wadded-wire member protrudes through the elastomeric material during activation of the compressive force used to make a compression-type connection of the electronic module to the substrate. Alternatively, a laser or the like may be employed to oblate the elastomeric material in the contact region to expose the wadded wire.

The carrier layer of insulating material may comprise material that is a rigid/semi-rigid insulator or a flexible insulator. Multiple layers of combinations of such material may also be employed. Instead of randomly wound wadded-wire, a tubular wire structure may be used for the conducting member. In such an arrangement, the tube would preferably be oriented on its side with the plane of the wire loops leaning somewhat to provide a linear force versus deflection characteristic.

BRIEF DESCRIPTION OF THE DRAWING

FIGS. 2A and 2B show cross-sectional views of two arrangements of encapsulated wadded-wire connectors in a rigid/semi-rigid insulating carrier layer, in accordance with the present invention.

FIGS. 3A-3C show cross-sectional views of further arrangements of encapsulated wadded-wire connectors in a flexible insulating carrier layer, in accordance with the present invention.

FIGS. 6A and 6B shows perspective views of another arrangement of mold halves used to fabricate another arrangement of encapsulated wadded-wire connectors, in accordance with the present invention.

DETAILED DESCRIPTION

Figure 1A:
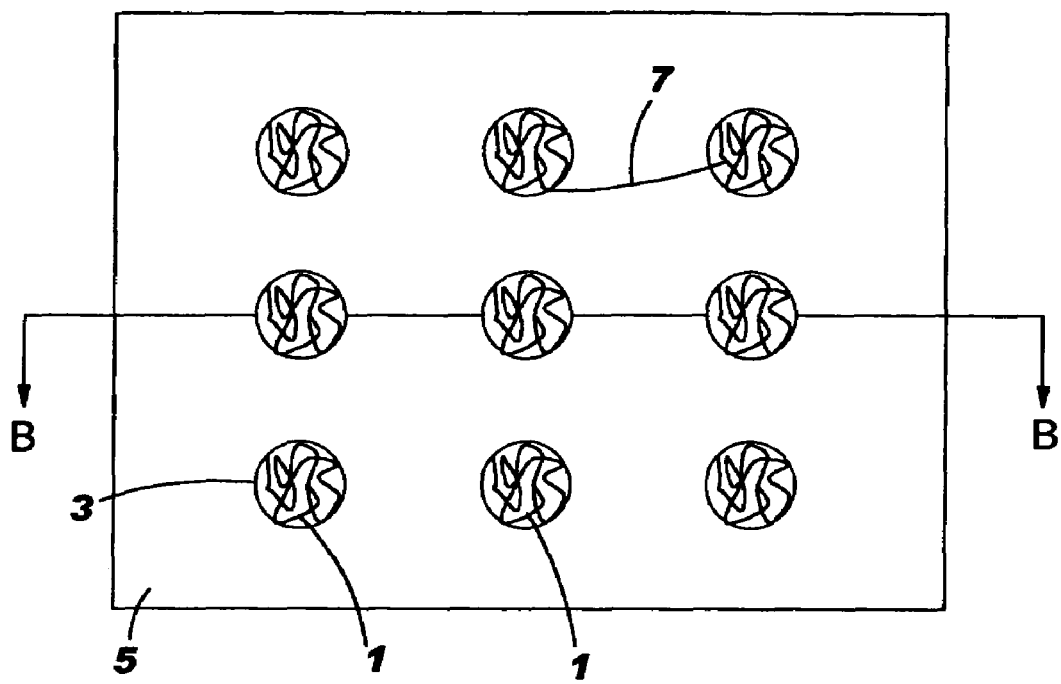
FIGS. 1A and 1B show the prior art structure of an interposer with wadded-wire button connectors.
Figure 1B:
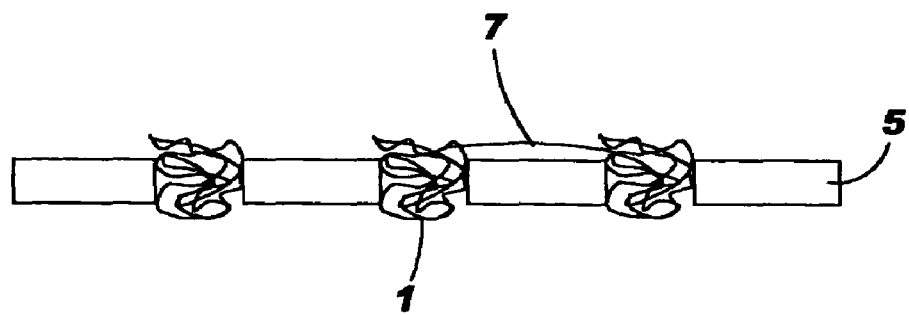

With reference to the prior art arrangement shown in FIGS. 1A and 11B, as hereinabove described, handling of the insulating carrier layer with wadded-wire connectors exposed, as shown, may result in loss of the complete connector or the smearing of connectors, as shown by wire lead portion 7 in FIG. 1B. Handling may occur, for example, in the assembly process of connecting the electronic module to a PWB, for example.

FIG. 2A shows one arrangement for encapsulating randomly wound wadded-wire connectors. In this arrangement, a conventional plastic rigid/semi-rigid insulating carrier layer 25A, is configured, for example, as generally shown in FIGS. 1A-1B, with an array of apertures holding wadded-wire connectors. As further shown in FIG. 2A, the connectors are overmolded with an elastomeric polymer material 29A so as to encapsulate wadded-wire connectors 21A. This may be done in a manner so as to leave the contact tips of wire loops and leads of connectors 21A exposed. Alternatively, encapsulating material covering the contact tips of wire loops and leads may be laser ablated, for example to expose the contact tips.

The elastomeric polymer encapsulating material may be any of a variety of elastomeric polymer materials. For example, the encapsulating polymer material may be an elastomeric silicone, such as, SYLGARD No. 182 made by Dow Corning or an elastomeric epoxy, such as, Epo-Tek No. 310 made by Epoxy Technology. The elastomeric encapsulating material may also be sufficiently thin, soft and deformable so as to allow the contact tips of the wadded-wire connectors to punch through the material and thereby expose the contact tips. As can be seen, the contact tips are thus the loops and leads of the wadded-wire at the interface surfaces to the electronic module and substrate, respectively. The modulus of each elastomeric material would typically be less than 5000 psi and, preferably, less than 2000 psi.

The rigid/semi-rigid insulating carrier layers 25A and 25B in FIGS. 2A and 2B may be made of, for example, liquid crystal polymer materials, such as, VECTRA's No. A 130 liquid crystal polymer material. Alternatively, nylon or polyphenylene sulfides, such as, RYTON (Phillips 66), or polycarbonates, such as LEXAN, (GE) may be used. The range of modulus for such materials is 377,000 psi to 2,175,000 psi. The wadded-wire connectors are typically randomly wound wadded resilient wire made of molybdenum, beryllium-copper or other electrically conductive metallic member.

Figure 5A:
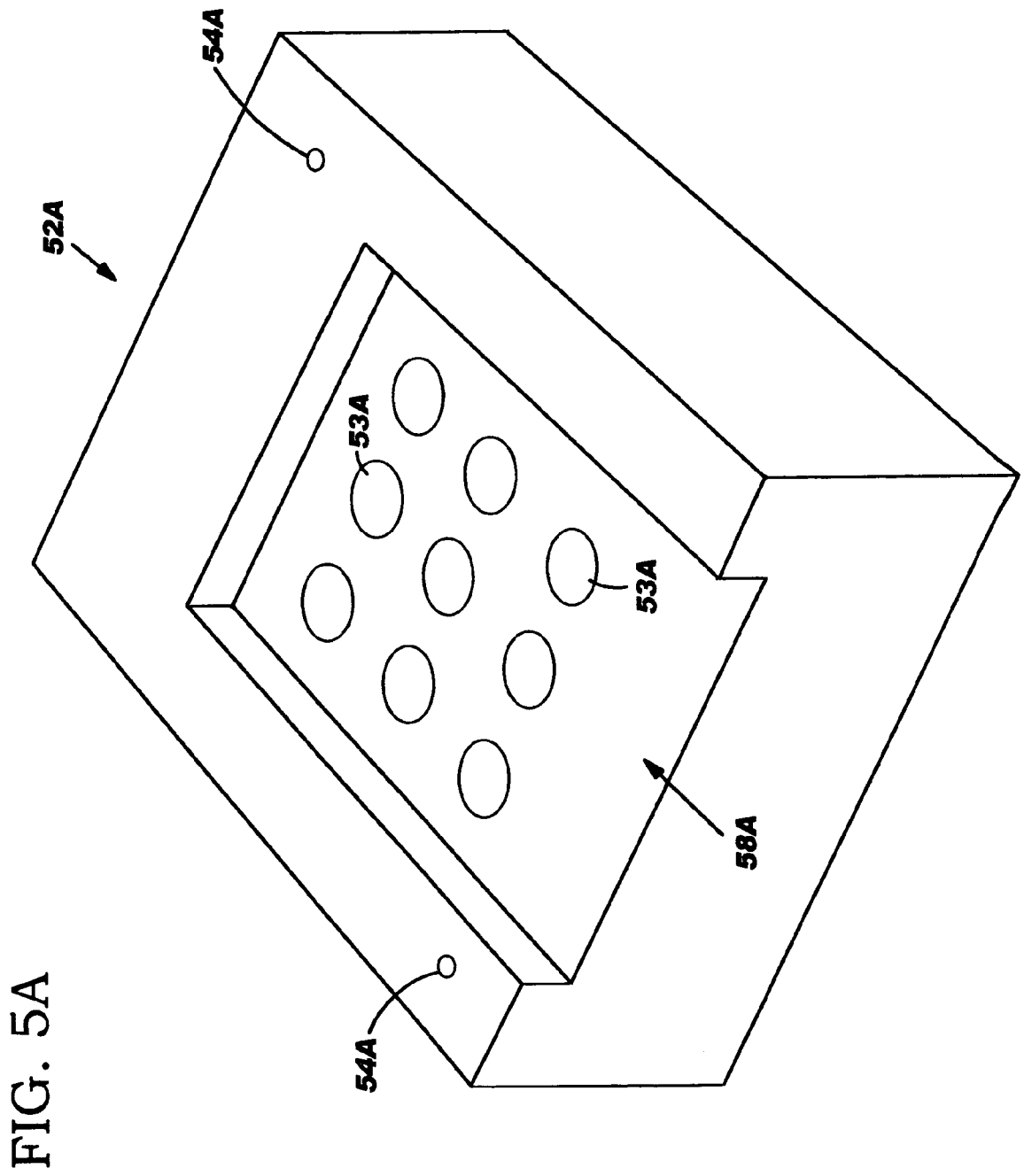
FIGS. 5A and 5B show perspective views of one arrangement of upper and lower mold halves used to fabricate one arrangement of encapsulated wadded-wire connectors, in accordance with the present invention.
Figure 5B:
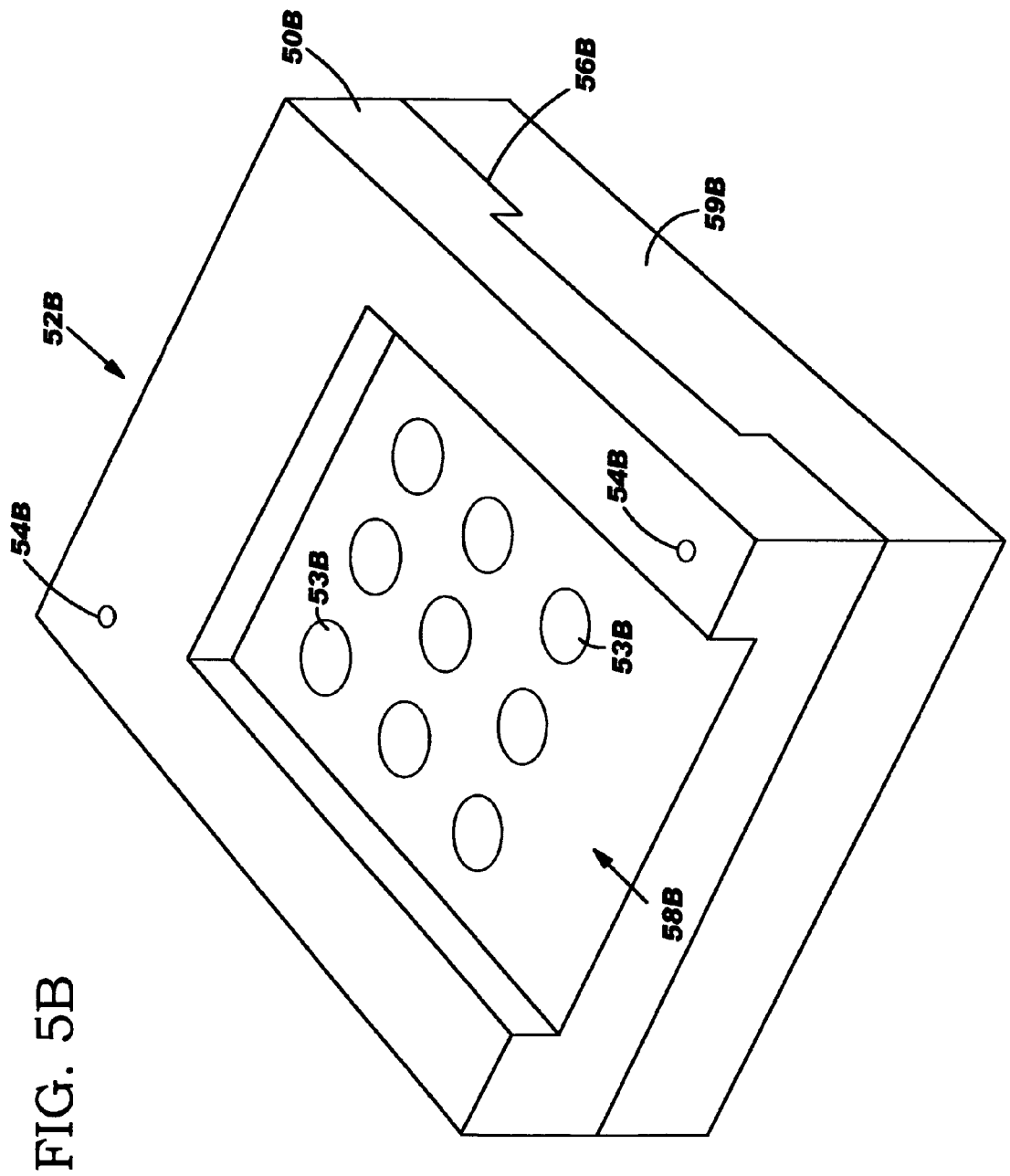
Figure 5C:
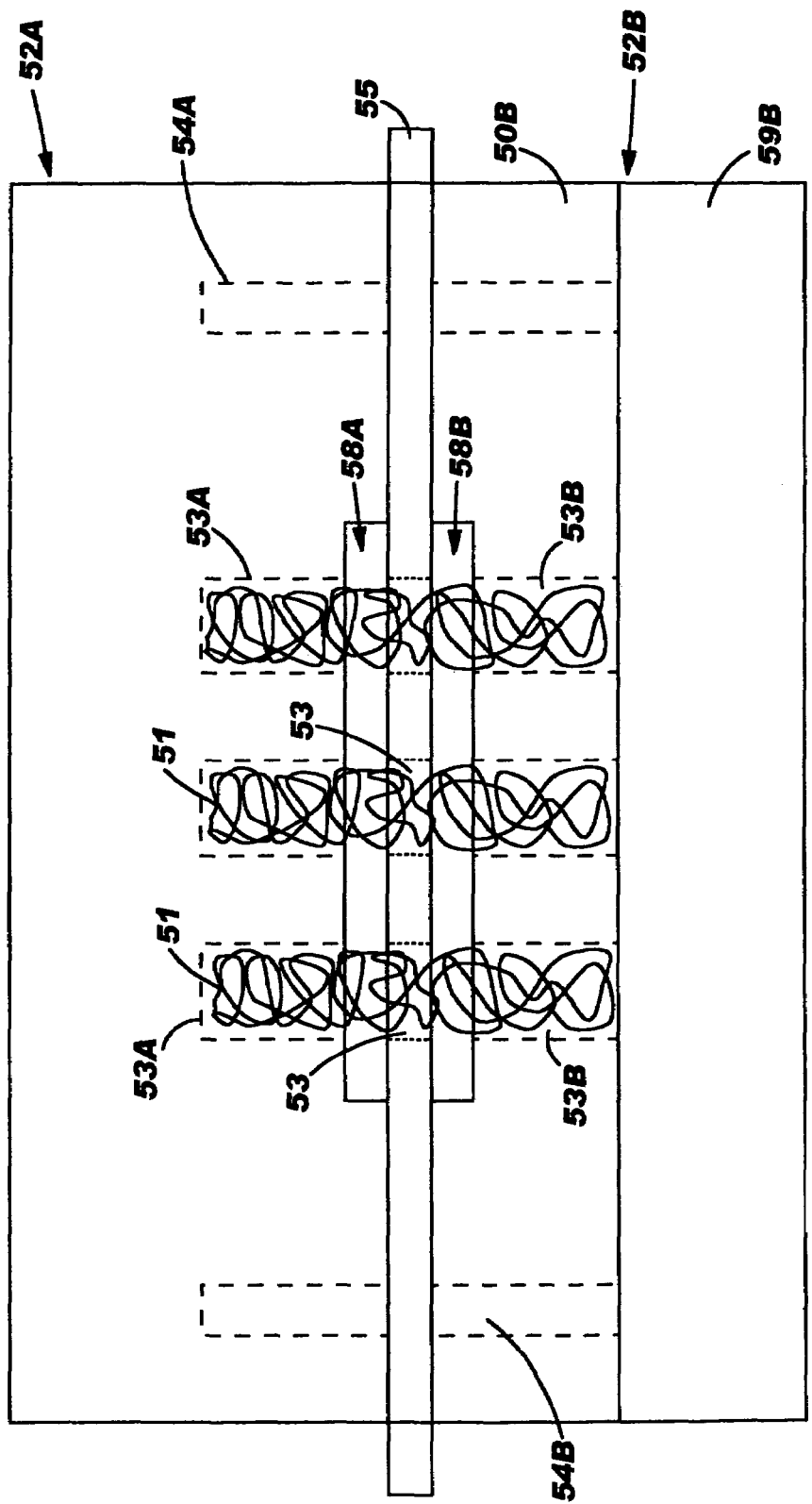
FIG. 5C shows a cross-sectional view of the mold halves of FIGS. 5A and 5B positioned on an insulating carrier layer.

The encapsulated wadded-wire conductor arrangement of FIG. 2A may be fabricated using the mold arrangement shown in FIGS. 5A-5C. The top half of the mold block 52A is shown in FIG. 5A. Apertures 53A in block 52A provide space to encapsulate the top portion of the wadded-wire that extend from the surface of the insulating carrier layer. Although only nine apertures are shown for illustrative purposes, it is clear that in practice, there would be a large number of apertures arrayed in block 52A. The recessed region 58A provides the mold throat/mold layer area where liquid mold material is poured in to form elastomeric polymer encapsulated wadded-wire connectors that extend from a layer of elastomeric polymer material. It is clear that the thickness of the layer of elastomeric polymer material is determined by the depth of recessed region 58A. This layer is shown as layer 27A in FIG. 2A, and the thickness of the layer is selected in accordance with design choice. Apertures 54A provide alignment holes for alignment pins.

FIG. 5B shows a similar mold block configuration for the bottom half of mold 52B. However, in the arrangement of FIG. 5B, mold block 52B comprises a split mold block. Mold block 52B is split along line 56B with bottom portion 59B being removable. As shown, block line 56B rises in the mid-section in the area of the apertures 53B to reduce and define the depth of the aperture array in the upper portion 50B of block 52B. In this regard, the aperture or cavity walls of apertures 53B may be vertical or tapered. FIGS. 3A-C show tapered walls. It is clear that whichever wall configuration is used, the aperture wall configuration would be the same in both the top half mold block 52A, in FIG. 5A and bottom half mold block 52B, in FIG. 5B.

It should be understood that bottom portion 59B of mold block 52B is removable to facilitate removal of the cast part. Thus, with removal of bottom portion 59B of mold block 52B, the cast part may be pushed out without damage. After removal of the cast part from mold block 52B, the upper half mold block 52A may be readily removed from the cast part.

It is clear, however, that both mold block 52A in FIG. 5A and mold block 52B in FIG. 5B may be split mold blocks, similar to that shown in FIG. 5B.

It is also clear that removable portion, such as bottom portion 59B of mold block 52B, may be used to facilitate assembly of parts before casting. Thus, after separating the removable bottom portion 59B from block 52B, wadded wire buttons may be inserted into the cavities 53B from below, through apertures in the insulating carrier layer and into the cavities 53A of the upper block half 52A. This can be seen more clearly with reference to FIG. 5C.

In FIG. 5C, the top half of the mold shown in FIG. 5A is positioned on the bottom half of the mold shown in FIG. 5B. Pins in alignment holes 54A and 54B act to position and align the mold halves. Any of a variety of arrangements may be employed to clamp the mold halves together. A rigid/semi-rigid insulating carrier layer 55 is positioned between the mold halves. Insulating carrier layer 55 may be, for example, a rigid/semi-rigid insulating carrier layer, like carrier layers 25A and 25B shown in FIGS. 2A and 2B, respectively. With bottom portion 59B of mold block 52B removed, wound wadded-wire connectors 51 may be pushed up into apertures 53B, 53 and 53A prior to encapsulation.

Alternatively, prior to positioning the top mold half and bottom mold half together, wadded-wire conductors 51 may be positioned in apertures 53 of insulating carrier layer 55 where they are held in place by friction. The mold halves may then be positioned over the wadded-wire connectors 51 so that the connectors are positioned in apertures 53A and 53B. Liquid elastomeric polymer material is then poured into mold throat/mold layer regions 58A/58B and cured.

It should be understood that the mold arrangements described herein are merely examples of ways in which the wadded-wire connectors may be encapsulated. It is clear that there are any of a variety of ways in which an rigid/semi-rigid and flexible insulating carrier layer with encapsulated wadded wire connectors may be fabricated.

In the arrangement of FIG. 2A, apertures 23A in insulating carrier layer 25A are approximately the same size or slightly smaller than the elastomeric encapsulation 29A over wadded-wire connectors 21A. Thus, the mold apertures and insulating carrier layer apertures used in FIG. 2A are approximately the same dimension, as shown in FIG. 5C. In FIG. 2B, however, the apertures 23B in insulating carrier layer 25B are considerably smaller than the apertures in the mold blocks 53A and 53B in FIG. 5. The main consideration in either arrangement is that the connector be completely encapsulated. In this regard, it should be understood that the drawings are not to scale nor is the size shown for corresponding parts, as depicted among the various figures, accurately related to one another.

FIG. 3A shows another interposer arrangement with wadded wire connectors encapsulated with elastomeric polymer material. In FIGS. 3A-C, the insulating carrier layers 35A, 35B and 35C may be made of a flexible dielectric material, such as, KAPTON. Materials, such as, UPILEX and epoxy coated woven glass, such as, G10, may also be used, as well as FR4. The modulus for such material may range from 435,000 psi to 1,305,000 psi. The mold arrangement of FIG. 5 may be used to form the interposer of FIG. 3 with the thickness of elastomeric polymer layer 37A formed on carrier layer 35A being selected to provide the desired degree of stiffness for handling, assembly and thermal cycling. Typically, the thickness of polymer layer 37A would be 5 to 10 mils. As shown, the elastomeric encapsulation 39A has sloped walls thus necessitating same slope in the aperture of the mold blocks.

Again, the elastomeric polymer material used for encapsulation may be sufficiently soft and thin along the flat interfacing surface of the elastomeric encapsulations such that when the interposer of FIG. 3A is clamped between electronic module and PWB, for example, loops and leads of the distal portion of wadded-wire connectors may push through the material skin to make contact with the electrical contacts of the electronic module and PWB. Alternatively, the elastomeric encapsulations may be ablated to expose the wire conductors.

Figure 6A:
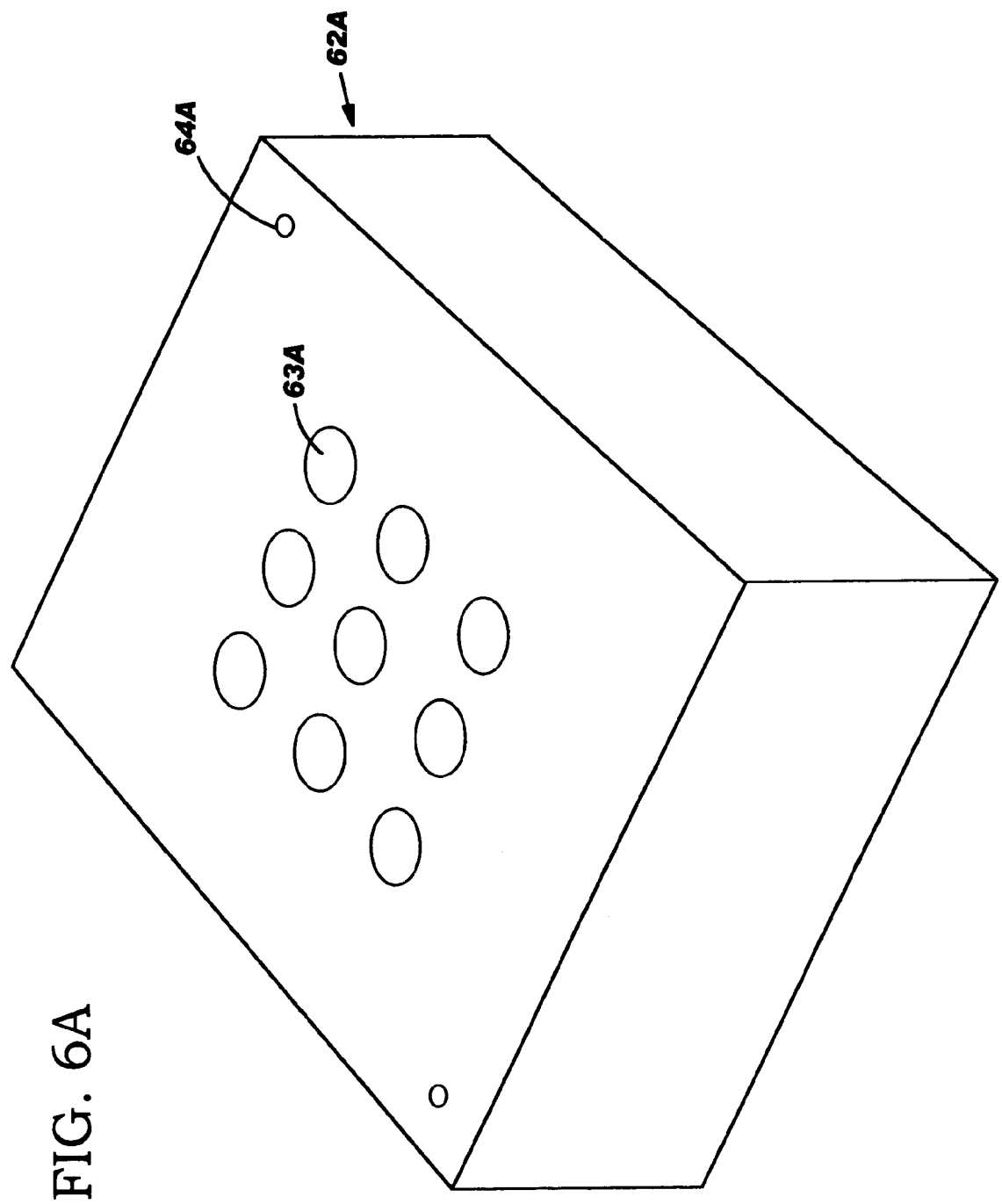
Figure 6C:
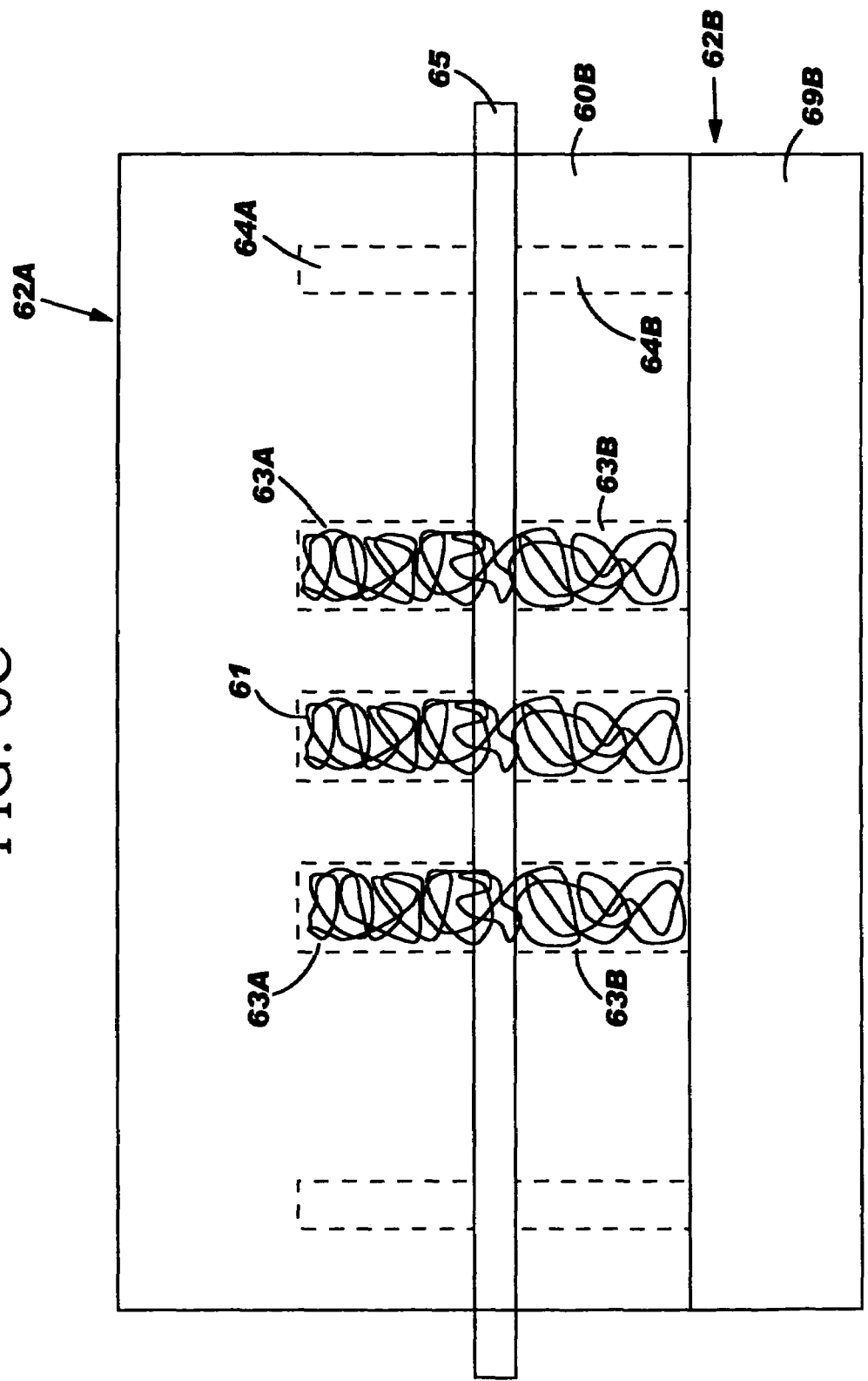
FIG. 6C shows a cross-sectional view of the mold halves of FIGS. 6A and 6B positioned on an insulating carrier layer.

The interposer arrangement of FIG. 3A may be made even thinner by eliminating the formation of the layer of elastomeric material 37A, as shown in FIG. 3A, on the flexible insulating carrier layer 35A. The thinner arrangement is shown in FIG. 3B. This may be accomplished in any of a variety of ways, such as with the mold arrangement shown in FIGS. 6A-C. As can be seen, the mold blocks 62A and 62B are the same as that shown in FIGS. 5A-C with the exception that no recessed regions, as shown at 58A and 58B is FIG. 5, are provided in FIGS. 6A-C. Without these recessions, encapsulation on flexible carrier layer 65 shown in FIG. 6C is limited to the aperture regions 63A and 63B, as shown in FIG. 6C. Again, although the apertures 63A and 63B are shown with vertical cylindrical walls, it is clear that the walls would slope for the encapsulation arrangements of FIGS. 3B-C.

The carrier layer 35B of the interposer arrangement of FIG. 3B may be made rigid/semi-rigid by adding additional stiffening layers 37C on opposing surfaces thereof between encapsulations 39C, as shown in FIG. 3C. These stiffening layers may be formed first and then bonded to flexible carrier layer 35C or alternatively, may be deposited thereon using some form of deposition technique, such as, vapor deposition, sputtering, or the like.

It should be understood that in any of the interposer arrangements shown in FIGS. 2A-C, FIGS. 3A-C and FIGS. 4A-B, that fewer or more layers may be employed in the insulating carrier layer without departing from the spirit of the invention. Included in these layers may be electrically conductive layers to provide shielding or reference planes as well as point to point wiring as known in the printed circuit wiring board art to electrically connect selected wadded wires contacts. In addition, multiple layers of the same or different materials may be employed consistent with the encapsulation of the wadded-wire conductors, as described herein.

Figure 4A:
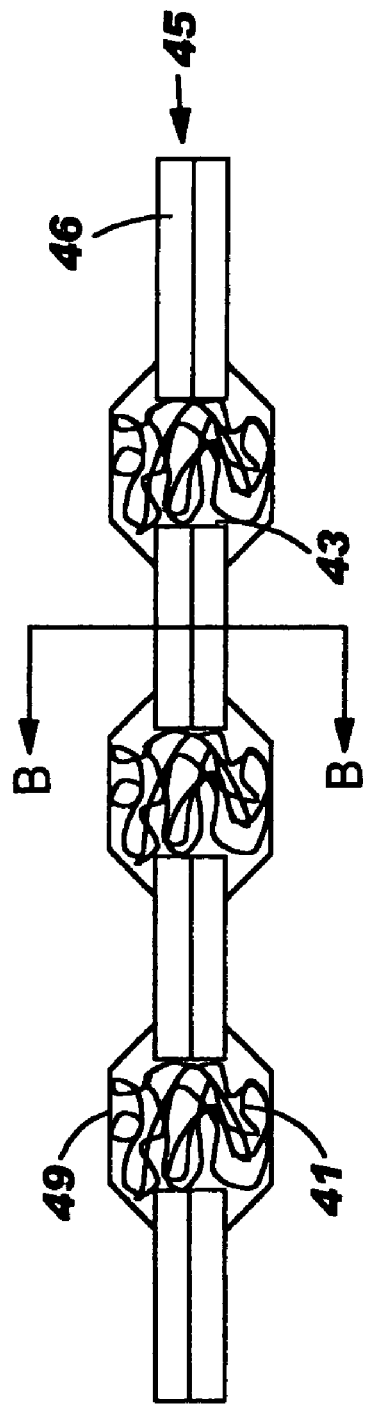
FIGS. 4A and 4B respectively show a cross-sectional side and end view of a still further arrangement of encapsulated wadded-wire connectors, and method of forming same, is a rigid/semi-rigid insulating carrier layer, in accordance with the present invention.
Figure 4B:
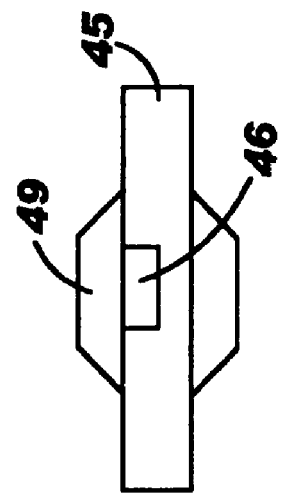

FIGS. 4A-B show a further interposer arrangement wherein the insulating carrier layer includes a molding channel/runner for encapsulating the wadded-wire connectors. Thus, insulating carrier layer 45 in FIGS. 4A-B may comprise a rigid/semi-rigid insulating material, similar to that shown in FIGS. 2A-B. Molding channel/runner 46 is shown as a through cut in the top portion of insulating carrier layer 45, as shown in FIG. 4B. Molding channel 46 acts to provide a path in which to feed liquid elastomeric insulating encapsulating material to form wire encapsulations 49. It is clear that channel 46 also includes a runner of hardened encapsulant when the molding process is completed and the encapsulant is cured.

It can be seen that the molding channel/runner 46 shown in FIGS. 4A-B acts to feed one row of apertures 43 in insulating carrier layer 45. In practice, however, to encapsulate an array of wadded wire conductors held in the apertures of an insulating carrier layer, it is clear that there would be a molding channel for each row or column of apertures. Alternatively, both rows and columns of molding channels intersecting at apertures in the carrier layer could be employed. The mold blocks shown in FIGS. 6A-C may be employed to fabricate the encapsulation arrangement shown in FIGS. 4A-B.

Figure 7:
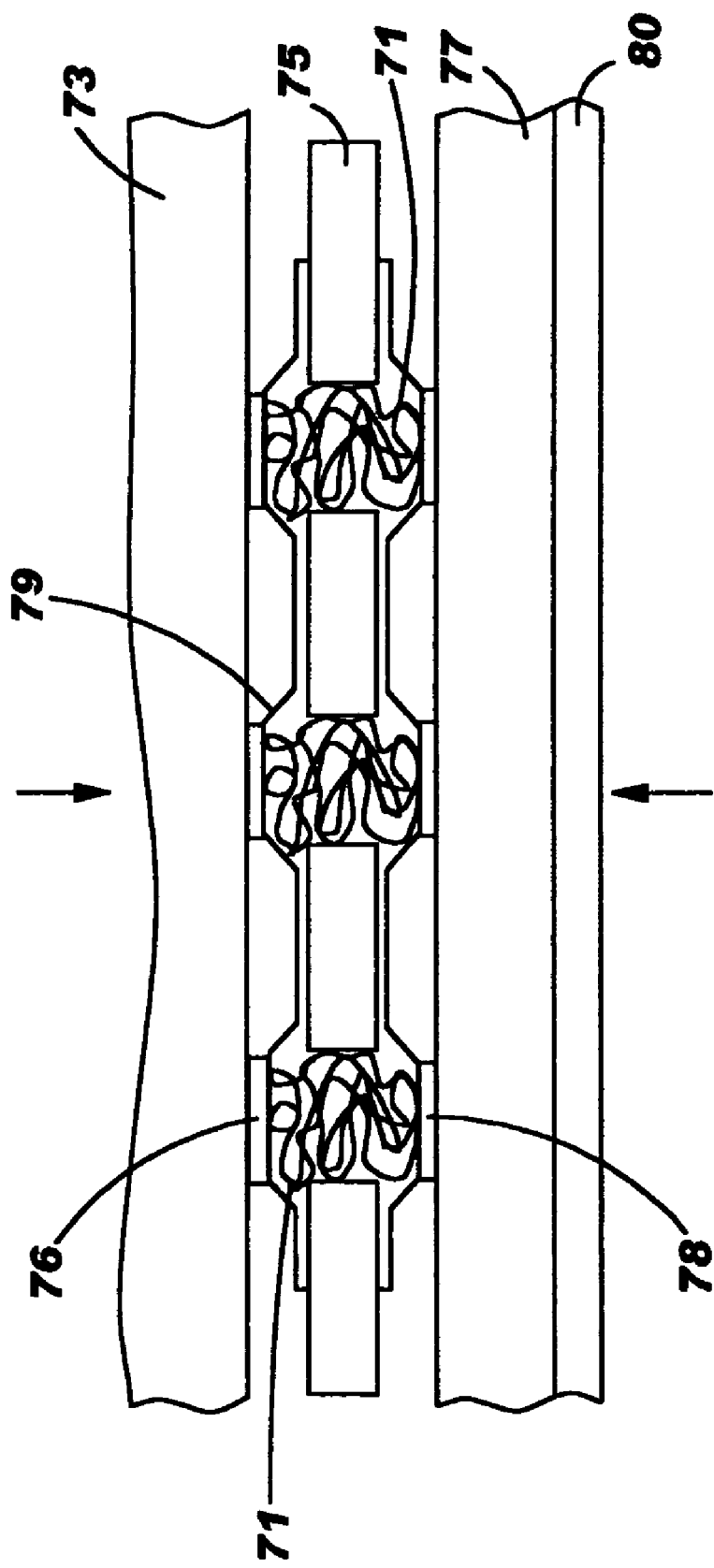
FIG. 7 shows a cross-sectional view of an interposer arrangement, in accordance with the present invention, positioned between an electronic module and substrate therefor.

FIG. 7 shows a cross-sectional view of the flexible interposer arrangement similar to that of FIG. 3A, as positioned between electronic module 73, such as a MCM, and substrate 77, such as a PWB. Conductive pads 76 on module 73 and conductive contacts 78 on substrate 77 are conventional metal pads and contacts made of, for example, copper or the like. Compressive force applied to module 73 and backing layer 80 on substrate 77 acts to clamp the arrangement together. A typical clamping force is one that would provide an upward normal force of at least about 30 grams against conductive pads 76 and a downward normal force of at least 30 grams against conductive contacts 78. The clamping force may also act to force the loops and leads of wadded-wire connectors 71 through the flat skin surface of elastomeric encapsulation region 79 at each interface with pads 76 and contacts 78 to make electrical contact therewith. In addition, the wadded-wire connectors 71 may deform themselves within the encapsulation as elastomeric encapsulation regions 79 deform under compressive force.

The overall resilience of the flexible carrier layer 75, deformable elastomeric encapsulation regions 79 and resilient wadded-wire connectors, as shown in FIG. 7, acts to ensure good electrical contact between module and substrate with the overall resilience acting to accommodate thermal and dimensional mismatch between module and substrate. It is clear that in similar manner, that any of the various interposer arrangements described herein will act as the arrangement of FIG. 3A to provide a resilient connection between electronic module and substrate therefor. Thus, in similar manner, the rigid/semi-rigid insulator carrier layers with elastomeric encapsulation of wadded-wire connectors provides resilience through the elastomeric encapsulation material and wadded wire connector. It is also clear that other forms of resilient connectors may be used. For example, a tubular wire structure may be used with the tube oriented on its side, as described above.

The advantages of employing an elastomeric encapsulated wadded-wire connector, in addition to its ability to deform, reside in the fact that there is resilient metal-to-metal contact at the opposing interfaces of the interposer. In addition, the contact is multi-pointed, through loops and leads, with one continuous conductor. By encapsulating the wadded-wire connectors, the connectors are captivated such as to prevent them from falling out and the loops and leads of the connector be not exposed to possible pulls and snags to smear the connector.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method of forming an interposer for connecting an electronic module to a substrate therefor, comprising the steps of:
providing an array of apertures in at least one layer of insulating material having an upper and lower surface with respective ones of said array of apertures extending from said lower surface to said upper surface and arranged to be aligned with electrical pads on an electronic module and electrical contacts on a substrate therefor;
positioning in each of said respective ones of said array of apertures a resilient electrical conductor randomly wound to form a resilient wadded wire connector that extends through the aperture therefor beyond said upper and lower surface; and
forming around each said resilient wadded wire connector extending beyond said upper and lower surface and the aperture therefor an elastomeric insulating material to encapsulate each said resilient wadded wire connector and allow said resilient wadded wire connector to deform under pressure extending to force said connector into said aperture.

2. The method as set forth in claim 1 wherein said elastomeric insulating material at least at the distal portion of each said resilient wadded connector extending beyond said upper and lower surface is sufficiently soft and thin so as to allow said resilient wadded wire connector to break through said elastomeric insulating material under said pressure.

3. The method of claim 1 including the step of ablating said elastomeric insulating material from said distal portion of each said resilient wadded wire conductor extending beyond both said upper and lower surface to expose a portion of said wadded wire connector.

4. The method as set forth in claim 1 wherein said step of forming around each said resilient wadded wire connector said elastomeric insulating material includes extending said elastomeric insulating material beyond each said wadded wire connector and the aperture therefor to form a layer of elastomeric insulating material on said lower and upper surface.

5. The method as set forth in claim 1 including the step of positioning said interposer between an electronic module and substrate therefor so as to align each encapsulated resilient wadded wire connector extending beyond said upper surface with a corresponding one of said electrical pads on said electronic module and each encapsulated wadded wire connector extending beyond said lower surface with a corresponding one of said electrical contacts on said substrate.

6. The method as set forth in claim 5 including the step of applying a compression force to said electronic module and said substrate to cause each said resilient wadded wire connector to make electrical contact with a corresponding one of said electrical pads on said electronic module at said upper surface and with a corresponding one of said electrical contacts on said substrate at said lower surface.

7. A method of forming an electronic module to substrate interconnecting structure, comprising the steps of:
providing at least one layer of insulating material having opposing surfaces and an array of apertures formed therethrough to each of said opposing surfaces;
positioning wound wadded wire connectors arranged to provide deformable resilient electrical conductors within respective ones of said apertures of said array of apertures of said at least one layer of insulating material so that distal portions of said resilient electrical conductors extend beyond said opposing surfaces of said layer of insulating material; and
forming an elastomeric insulating material around each of said deformable resilient electrical conductors within said apertures and extending beyond said apertures over at least a portion of each of said opposing surfaces around said apertures to encapsulate said electrical conductors within said apertures.

8. The method as set forth in claim 7 wherein said distal portions of said resilient electrical conductors that extend beyond said opposing surfaces include loops and leads at said distal portions and wherein said elastomeric insulating material forms a thin soft layer over said loops and leads.

9. The method of claim 7 wherein said wadded wire connectors are tubular wire structures arranged within said apertures to be oriented on its side with the plane of the wire loops of said tubular wire structure leaning from the axis of said apertures to provide resilience to force along said axes.

10. The method as set forth in claim 7 wherein said layer of insulating material is flexible.

11. The method as set forth in claim 7 wherein said layer of insulating material is rigid/semi-rigid and is selected from among liquid crystal polymers, nylon, polyphenylene sulfides and poly carbonates.

12. The method as set forth in claim 7 including the steps of forming a channel in said layer of insulating material extending along each line of apertures of said array of apertures and feeding liquid elastomeric insulating material into said channel to each aperture to encapsulate each of said resilient electrical conductors.

13. The method as set forth in claim 8 wherein said elastomeric insulating material is sufficiently thin and soft so as to allow said loops and leads to extend therethrough under compression.

* * * * *